United States Patent [19]

Oshitani et al.

[11] Patent Number: 4,531,792
[45] Date of Patent: Jul. 30, 1985

[54] IC CONNECTOR

[75] Inventors: Akiyoshi Oshitani; Akira Katsumata, both of Tokyo, Japan

[73] Assignee: Kel Corporation, Tokyo, Japan

[21] Appl. No.: 459,205

[22] Filed: Jan. 19, 1983

[30] Foreign Application Priority Data

Jan. 29, 1982 [JP] Japan .................... 57-13105

[51] Int. Cl.³ ............................................. H01R 13/62
[52] U.S. Cl. ............................ 339/17 CF; 339/75 MP; 339/176 M
[58] Field of Search ........... 339/17 CF, 75 MP, 75 M, 339/74 R, 176 M

[56] References Cited

U.S. PATENT DOCUMENTS

| | | | |
|---|---|---|---|
| 3,526,869 | 1/1969 | Conrad et al. | 339/75 MP |
| 4,080,032 | 3/1978 | Cherian et al. | 339/75 M |
| 4,133,592 | 1/1979 | Cobaugh et al. | 339/75 MP |
| 4,178,053 | 12/1979 | Eifort | 339/75 MP |
| 4,293,175 | 10/1981 | Cutchaw | 339/17 CF |
| 4,314,736 | 2/1982 | Demnianiak | 339/75 MP |
| 4,375,309 | 3/1983 | Griffin | 339/176 M |
| 4,391,408 | 7/1983 | Hanlon et al. | 339/17 CF |
| 4,392,705 | 7/1983 | Andrews et al. | 339/75 MP |
| 4,418,974 | 12/1983 | MacDougall | 339/17 CF |

FOREIGN PATENT DOCUMENTS

| | | |
|---|---|---|
| 53-151369 | 11/1978 | Japan . |
| 56-75486 | 6/1981 | Japan . |
| 57-78782 | 5/1982 | Japan . |

OTHER PUBLICATIONS

Conference: 12th Annual Connector Symposium Proceedings, Cherry Hill, N.J., (Oct. 17-18, 1979), by G. Cherian & E. Bright.
Conference: 13th Electrical Electronics Insulation Conference, Chicago, Ill., (Sep. 25-29, 1977), by G. Cherian.
"Nippon Amp. Co., Ltd. Catalog", PC(2)18, '81-8, pp. 14-16.
Wells Electronics, Inc. Catalog, "Welcon", p. 3.

Primary Examiner—Gil Weidenfeld
Assistant Examiner—Thomas M. Kline
Attorney, Agent, or Firm—Birch, Stewart, Kolasch & Birch

[57] ABSTRACT

In an IC connector for connecting lead terminals of an IC package of the dual in-line type to terminals of a circuit board, first grooves and first projections are formed on two surfaces of a slide body. The main body has two walls each of which has a surface which has a plurality of second grooves and which opposes at least one surface of the slide body. One end of each connecting terminal is inserted in each second groove. The other end of each connecting terminal extends through each second groove to be connected to a predetermined terminal of the circuit board. The slide body is supported by a supporting means such that the slide body may be movable between a first position and a second position along the direction of arrangement of the second grooves. When the slide body is in the first position, the first and second grooves define gaps therebetween into which or from which the lead terminals may be inserted or removed. When the slide body is in the second position, the second grooves and first projections oppose each other so that the first projections urge the connecting terminals against the second grooves against the elastic force of the connecting terminals. When the lead terminals are inserted in the second grooves, the connecting terminals and the lead terminals are urged against each other.

13 Claims, 20 Drawing Figures

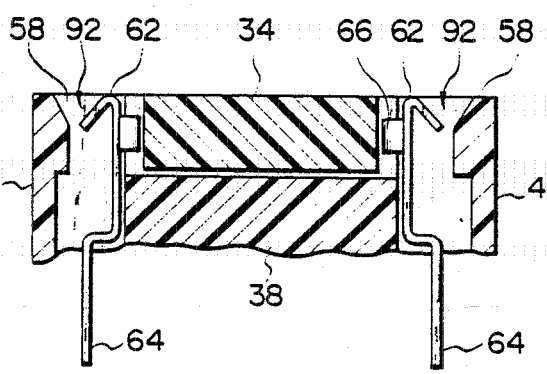
F I G. 13
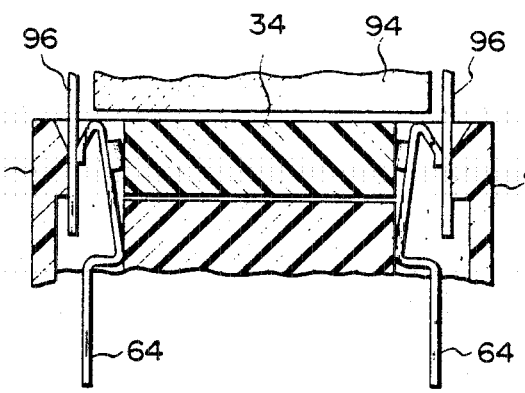
F I G. 14
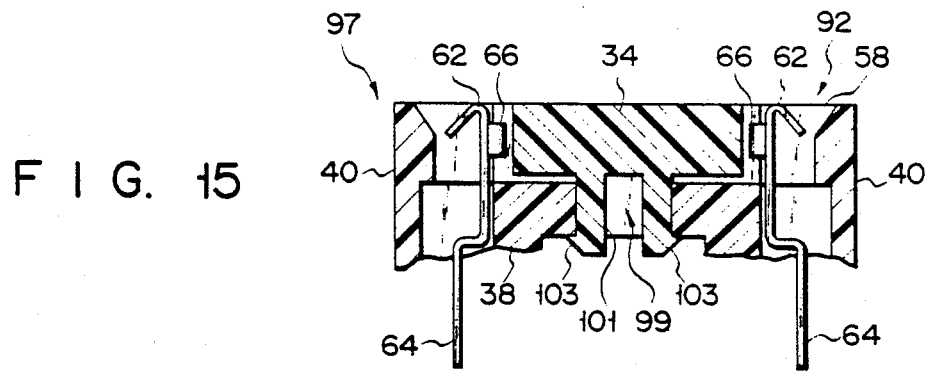
F I G. 15

IC CONNECTOR

BACKGROUND OF THE INVENTION

The present invention relates to an IC connector and, more particularly, to an IC connector for connecting lead terminals of an integrated circuit package (to be referred to as an IC package hereinafter) to connecting terminals.

An IC package of the in-Line type, especially the dual in-line type, incorporating an IC chip generally has a plurality of lead terminals which are connected to the IC chip inside the package and which are aligned parallel to each other to extend outside the package. The lead terminals are inserted into the IC connector so as to be connected to the corresponding connecting terminals. Since the IC package of the dual in-line type must frequently be replaced due to breakdown, repair or other reasons, the IC connector must allow easy mounting and demounting of the IC package of the dual in-line type. In other words, connection and disconnection of the lead terminals and the connecting terminals must be easy. However, the conventional IC connector has drawbacks to be described below.

In a conventional IC connector shown in FIGS. 1 and 2, when lead terminals 4 extending from an IC package 2 of the dual in-line type are connected to connecting terminals 8, respectively, the lead terminals 4 are inserted into holes 6 formed in the IC connector 1. The holes 6 are aligned almost linearly in correspondence with the lead terminals 4. The connecting terminals 8 having contact portions of substantially V shapes are respectively fixed in the holes 6. When a lever 9 is moved from the position indicated by the two-dots dashed line to a position indicated by the solid line in the figure, a slide plate 10 with the IC package of the dual in-line type placed thereon is moved in the direction indicated by arrow 12. Thus, the lead terminals 4 are urged against the contact portions of the connecting terminals 8 as shown in FIG. 2, so that the lead terminals 4 and the connecting terminals 8 are electrically connected. In order to demount the IC package 2 of the dual in-line type from the IC connector 1, the lever 9 is moved from the position indicated by the solid line to the position indicated by the two-dots dashed line. Then, the lead terminals 4 are separated from the connecting terminals 8 through the slide plate 10. The IC package 2 may then be demounted together with the lead terminals 4.

The conventional IC connector 1 described above has the following drawbacks.

First, when the lead terminals are urged against the connecting terminals, the IC package is moved to exert a considerable great force on the proximal portion of each lead terminal. This may lead to damage to the proximal portion of the lead terminal.

Secondly, contact pressure and range between each lead terminal and an associated connecting terminal vary in accordance with individual lead terminals; therefore, uniform contact between the lead terminals and the connecting terminals may not be obtained.

Thirdly, since the sliding range of the slide plate is long, the size of the IC connector becomes great. For this reason, when this conventional IC connector is used, the number of IC packages which may be mounted within a unit area of the printed circuit board becomes smaller.

Lastly, a lever is required to complicate the structure of the IC connector.

Another conventional IC connector will now be described with reference to FIGS. 3 and 4. Holes (not shown) in which connecting terminals 16 with elasticity are fixed are formed in a main body 15. Holes 18 are formed in a slide plate 24 in correspondence with these holes so as to guide lead terminals 22 of an IC package 20 of the dual in-line type. In order to connect the lead terminals 22 to the connecting terminals 16 of the IC connector 14, the IC package 20 is urged against and is placed on the slide plate 24, and the lead terminals 22 are forcibly inserted into holes (not shown) of the IC connector through the holes 18. As shown in FIG. 4, each lead terminal 22 urges against the associated connecting terminal 16 against its elastic force. In order to demount the IC package 20 from the IC connector 14, that is, when the lead terminals 22 are disconnected from the connecting terminals 16, the distal end of a screwdriver is inserted into a groove 26 formed in the IC connector 14. The screwdriver is then pivoted in the direction to contact with a projection 28 of the slide plate 24. Since the slide plate 24 moves with the IC package 20 placed thereon in its longitudinal direction, contact between the lead terminals 22 and the connecting terminals 16 is released by forcible movement of the lead terminals 22. More specifically, the lead terminals 22 are moved in the direction perpendicular to the direction along which elastic force of the connecting terminals 16 acts, thereby releasing contact between the connecting terminals 16 and the lead terminals 22. The IC package 20 may then be removed from the IC connector 14 by the operator. This conventional IC connector also has the following drawbacks.

First, since the IC package is forcibly moved so as to remove the IC package from the IC connector, a great force acts on the proximal portion of each lead terminal. The proximal portion of the lead terminal may be damaged.

Secondly, when the lead terminals are connected to the connecting terminals, that is, when the IC package is connected to the IC connector, the lead terminals must be forcibly inserted against the elastic force of the connecting terminals. This means that a considerable force acts on the IC package on the slide plate. However, since the IC package is generally made of a fragile material such as a ceramic, the IC package may be damaged when it is pressed, or when the IC package is connected to the IC connector.

SUMMARY OF THE INVENTION

It is an object of the present invention to provide an IC connector which allows easy mounting and demounting of an IC package and which is capable of connecting lead terminals with connecting terminals with reliability.

More specifically, it is a first object of the present invention to provide an IC connector which allows connection/disconnection of the lead terminals and connecting terminals without requiring moving the IC package relative to the IC connector.

It is a second object of the present invention to provide an IC connector in which the respective lead terminals are brought into contact with the associated connecting terminals with a substantially uniform contact pressure.

It is a third object of the present invention to provide an IC connector of a simple construction.

It is a fourth object of the present invention to provide an IC connector of a small size.

It is a fifth object of the present invention to provide an IC connector whose connecting terminals can be connected or disconnected to or from the lead terminals of an IC package, using a little force, whereby the IC package is mounted on or from the IC connector with a little force.

According to an aspect of the present invention, there is provided an IC connector for connecting lead terminals extending from an IC package of the in-line type to terminals of a circuit board, comprising; a slide body which is made of an insulating material and which has an array of first grooves and first projections on at least one surface thereof, a main body which is made of an insulating material and which has a plurality of second grooves on a surface thereof opposing said one surface of said slide body, said plurality of second grooves being formed along a direction of arrangement of said first grooves and first projections, connecting terminals, which are made of an electrical conductive material and have an elastic structure, one end of each of which is mounted in one of said second grooves, and the other end of each of which is adapted to be connected to a predetermined terminal of the circuit board, and supporting means for supporting said slide body to be movable, along a direction of arrangement of said second grooves, to a first position and a second position, when said slide body is located in said first position, said first and second grooves oppose each other and form a gap between each of said first grooves and a corresponding one of said second grooves so as to receive one of said lead terminals therein, and when said slide body is located in said second position, said first projections oppose said second grooves and said first projections urge said connecting terminals against said second grooves and urge said connecting terminals against said lead terminals when said lead terminals are inserted in said second grooves.

BRIEF DESCRIPTION OF THE DRAWINGS

FIG. 13 is a partial sectional view of the IC connector shown in FIG. 9 along the line IX—IX therein;

FIG. 14 is a partial sectional view of the IC connector shown in FIG. 10 along the line X—X therein;

FIG. 15 is a partial sectional view of an IC connector according to a second embodiment of the present invention;

DETAILED DESCRIPTION OF THE PREFERRED EMBODIMENTS

The preferred embodiments of the present invention will now be described with reference to the accompanying drawings.

Figure 2:
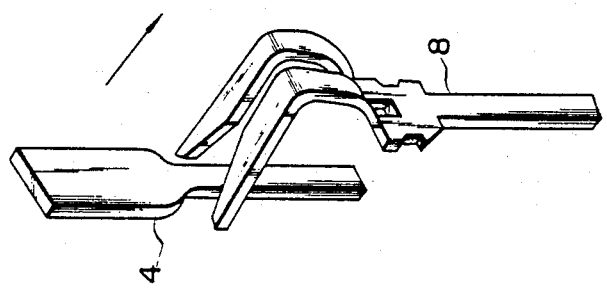
FIG. 2 is a perspective view of a lead terminal and a connecting terminal shown in FIG. 1.
Figure 1:
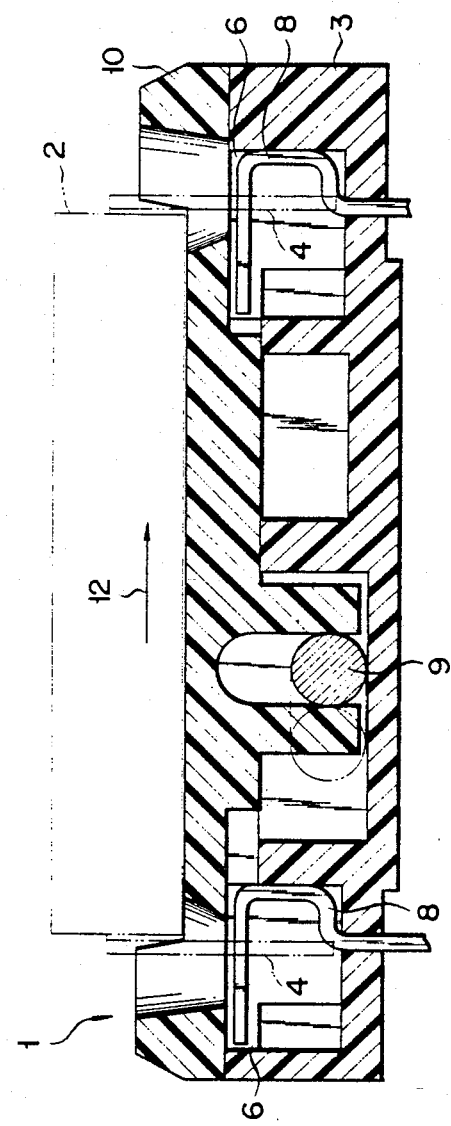
FIG. 1 is a sectional view of a conventional IC connector.
Figure 3:
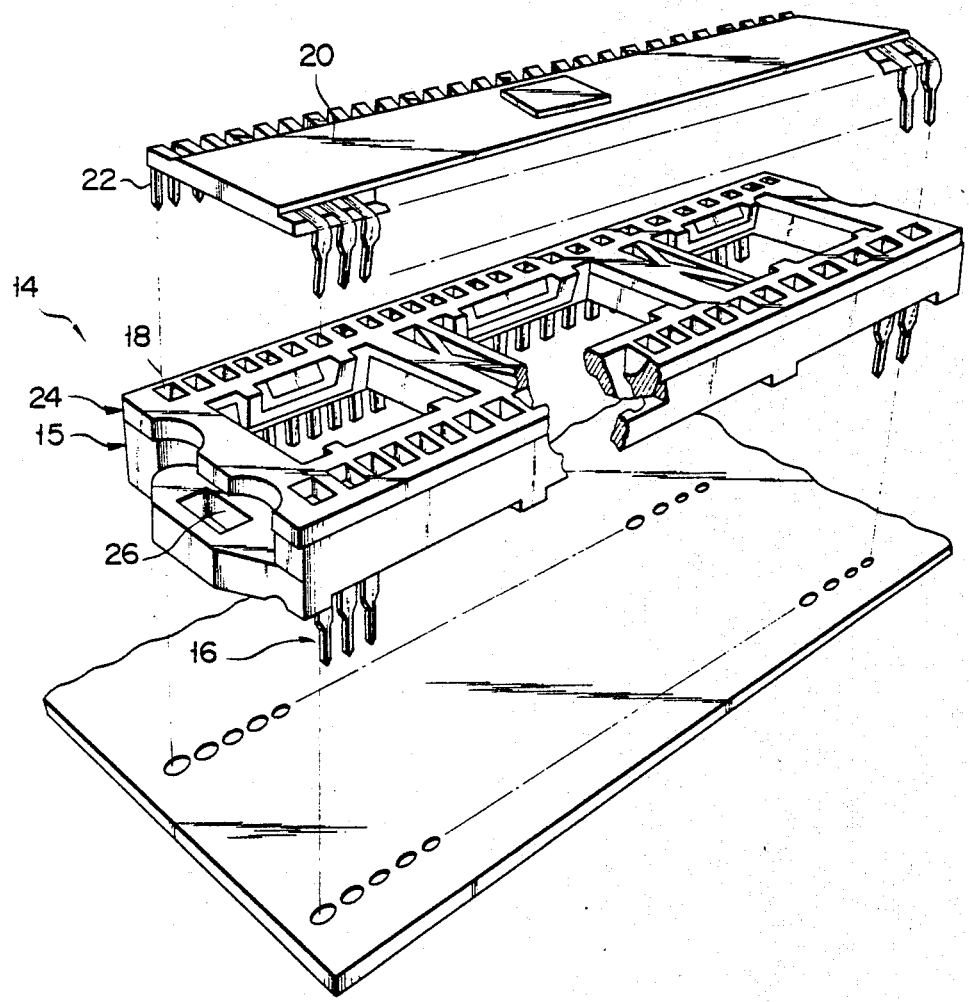
FIG. 3 is a perspective view of another conventional IC connector with an IC package.
Figure 4:
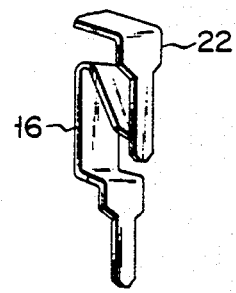
FIG. 4 is a perspective view of a lead terminal and a connecting terminal shown in FIG. 3.
Figure 5:
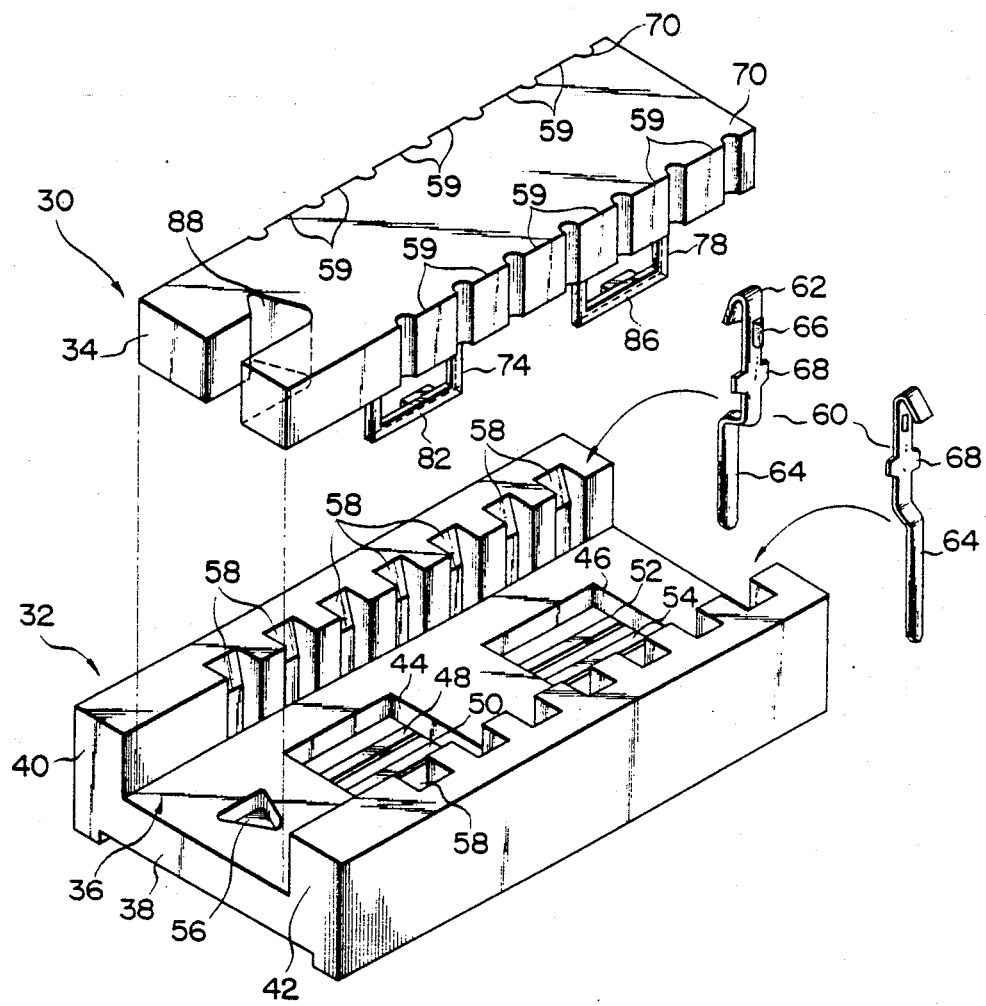
FIG. 5 is an exploded perspective view of an IC connector according to a first embodiment of the present invention.
Figure 6:
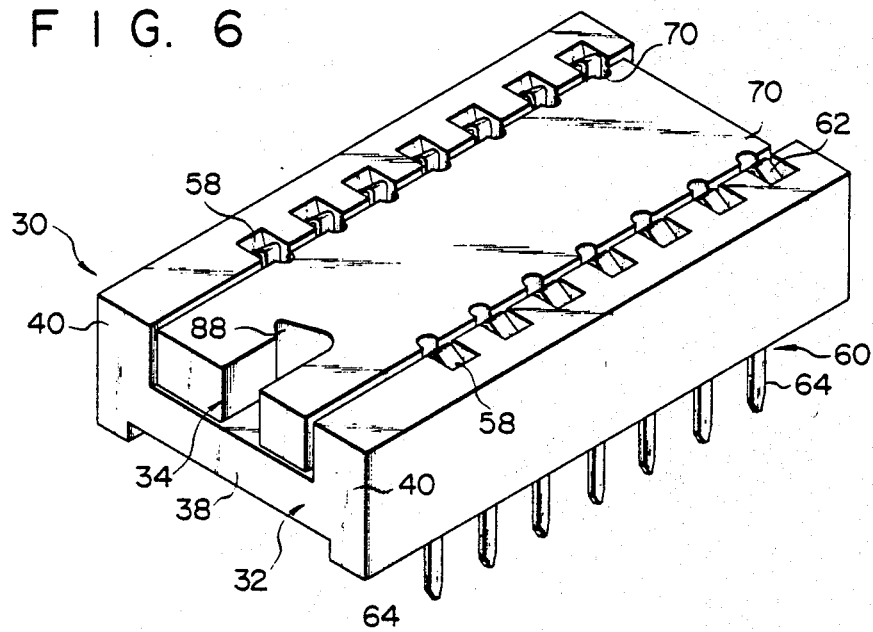
FIG. 6 is a perspective view of the IC connector shown in FIG. 5.

Referring to FIGS. 5 and 6, an IC connector 30 according to the first embodiment of the present invention has a main body 32 and a slide plate 34 which are made of an insulating plastic material. The main body 32 consists of a bottom plate 38 and walls 40 and 42 extending at both edges of the bottom plate 38 along the longitudinal direction. The bottom plate 38 and the walls 40 and 42 together define, at the center of the main body 32, a first recess 36 in which the slide plate 34 is slidably fitted. Two first holes 44 and 46 are formed in the bottom plate 38 to be in alignment with each other in the longitudinal direction thereof. Two pairs of first support members 48 and 50 and 52 and 54 for supporting the slide plate 34 to be described later respectively extend in the first holes 44 and 46. A second recess 56 having a substantially triangular opening to receive the distal end of an instrument such as a screwdriver is formed at one end of the bottom plate 38 along its longitudinal direction.

A plurality of first grooves 58 for receiving the connecting terminals to be described later are formed on the sides of the walls 40 and 42 which define the first recess 36. The first grooves 58 extend from the upper end of each wall toward the bottom plate 38 and through the bottom plate 38. The first grooves 58 are formed at equal intervals along the longitudinal direction of the bottom plate 38. Connecting terminals 60 to be connected to the lead terminals to be described later are fixed inside the first grooves 58.

The connecting terminals 60 are made of an electrically conductive material such as a copper alloy.

One end 62 of each connecting terminal 60 is bent, thus forming a spring. The other end 64 of each connecting terminal 60 projects downward from the bottom plate 38 to be connected to a printed circuit board (not shown). A projection 66 is provided in the vicinity of the one end 62 of the connecting terminal 60. When the slide plate 34 is slid, the projection 66 is urged by the slide plate 34. A step 68 is formed at the intermediate position of the connecting terminal 60. The step 68 engages with the surface defining the first groove 58 of wall 40 or 42 and keeps the connecting terminal 60 stationary in the first groove 58 when the connecting terminal 60 is inserted in the groove 58. The step 68 extends along the direction of width of the connecting terminal 60.

The slide plate 34 to be fitted in the first recess 36 has a shape corresponding thereto. Second grooves 70 are formed at equal intervals along both edges of the slide plate 34 and in correspondence with the first grooves 58. Flat portions 59 are defined between the second grooves 70 so as to urge the projections 66 when the slide plate 34 is slid.

Two pairs of second support members 74 and 78 (in the drawing only one of the each pair is shown) are formed on the lower surface of the slide plate 34, that is, the surface of the slide plate 34 which opposes the bottom plate 38 upon insertion of the slide plate 34 in the first recess 36. The second support members 74 and 78 can be fitted in the first holes 44 and 46 and oppose each other to extend downward. Second projections 82 and 86 are formed on the opposing surfaces of the second support members 74 and 78, respectively. When the second support members 74 and 78 are respectively inserted in the first holes 44 and 46, the second projections 82 and 86 respectively engage with the first support members 48, 50, 52 and 54, respectively, so as to be free to slide. In other words, when the slide plate 34 is fitted in the first recess 36, the second projections 82 and 86 are slidably supported by the first support members 48, 50, 52 and 54. Therefore, the slide plate 34 is fitted in the first recess 36 such that it is movable along the longitudinal direction of the first recess 36. A second hole 88 for allowing insertion of a screwdriver or the like to slide the slide plate 34 is formed at one end of the slide plate 34. The second hole 88 has an opening with corners at a position corresponding to the second recess 56. The distal end of a screwdriver or the like may be inserted into the second hole 88 and into the first recess 56. The screwdriver or the like may then be pivoted in a predetermined direction to slide the slide plate 34 with respect to the main body 32.

An IC package of the dual in-line type will now be described with reference to FIG. 8. An IC chip (not shown) is housed in an IC package 94. Lead terminals 96 connected to the IC chip extend from both edges of the IC package 94 at equal intervals and in one direction.

The mode of operation of the IC package of the first embodiment will now be described with reference to FIGS. 5 to 14.

When the second grooves 70 of the slide plate 34 respectively oppose the first grooves 58 as shown in FIG. 6, one end 62 of each connecting terminal 60 inserted within each associated groove 58 forms a gap 92 together with the surface of the groove 58. Since dimensions of the gap 92 is slightly greater than those of the lead terminal, the lead terminal 96 can be inserted into the groove 58 without requiring almost any force.

Figure 7:
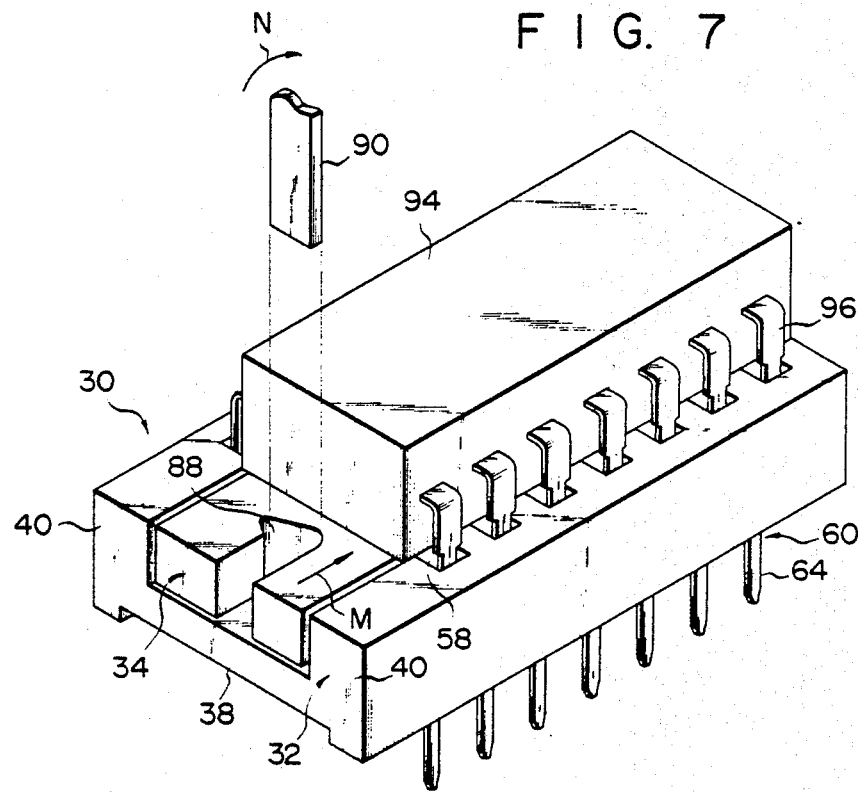
FIGS. 7 and 8 are perspective views of the IC connector and the IC package for explaining the mode of operation of the IC connector shown in FIG. 6.

Subsequently, as shown in FIG. 7, each lead terminal 96 is inserted into the corresponding groove 58. Thus, the IC package 94 is mounted on the IC connector 30.

Figure 8:
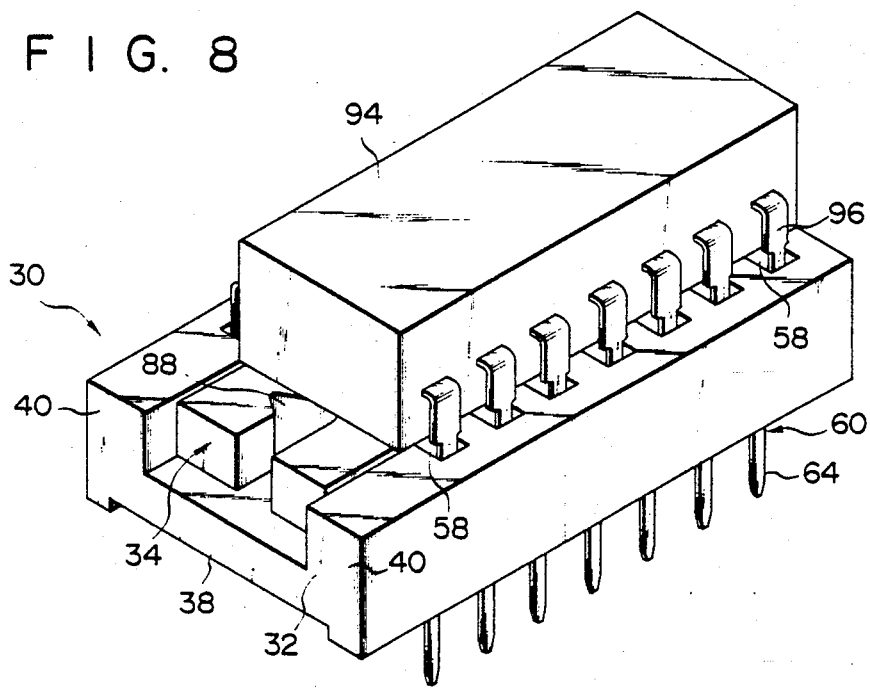
Figure 10:
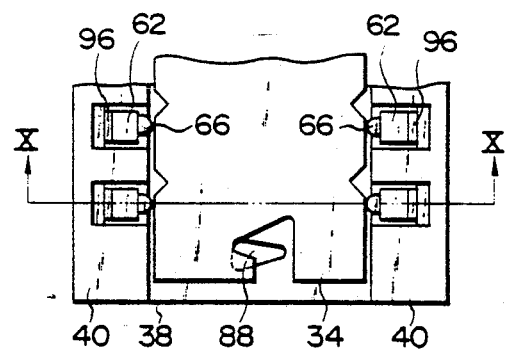
Figure 11:
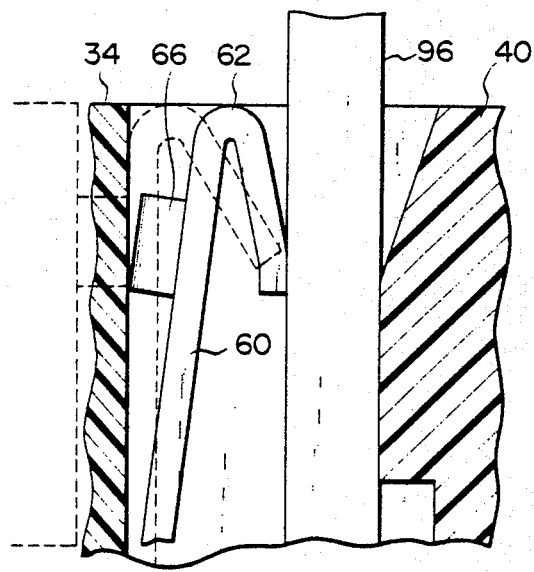
FIG. 11 is a partial sectional view of the IC connector for explaining the mode of operation of the IC connector shown in FIG. 6.

When a distal end 90 of a screwdriver is inserted in the second hole 88 and the screwdriver is pivoted in the direction indicated by arrow N, the slide plate 34 is slid in the direction indicated by arrow M and is stopped at a predetermined position as shown in FIG. 8. Then, as shown in FIGS. 10, 11 and 14, each projection 66 is urged against the slide plate 34, and the one end 62 of each connecting terminal 60 is bent to be urged against the corresponding lead terminal 96. In this manner, the lead terminals 96 and the connecting terminals 60 are electrically connected.

Figure 12:
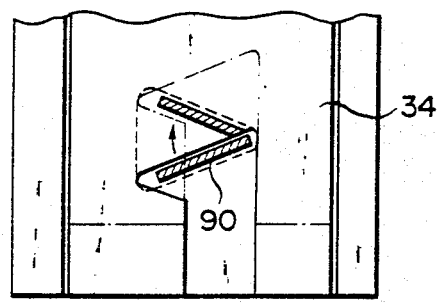
FIG. 12 is a partial plan view of the IC connector for explaining the mode of operation of the IC connector shown in FIG. 6.

The slide operation of the slide plate 34 will now be described. The distal end 90 of the screwdriver is abutted against the inner surface defining the second recess 56 through the second hole 88, as shown in FIG. 7. The screwdriver is pivoted about the vertex of the triangle of the second recess 56, as shown in FIG. 12. Then, the distal end 90 of the screwdriver urges one side of the second hole 88, and the slide plate 34 is slid in the direction indicated by arrow M, as shown in FIG. 7.

Figure 9:
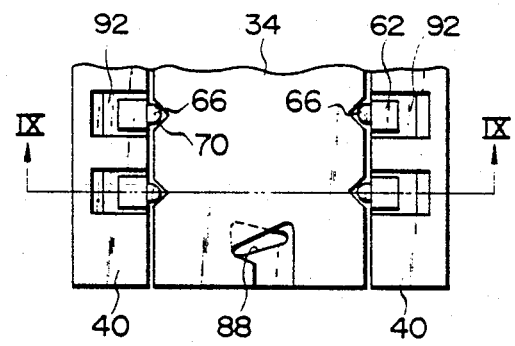
FIGS. 9 and 10 are partial plan views of the IC connector for explaining the mode of operation of the IC connector shown in FIG. 6.

When it is required to remove an IC package mounted on the IC connector 30 for repair or for replacement, the operator inserts a screwdriver into the second hole 88. When the screwdriver is pivoted in the reverse direction indicated by arrow N (FIG. 7). Then, as shown in FIGS. 7, 9 and 11, the slide plate 34, is slid to align the first grooves 58 with the second grooves 70. The one end 62 of each connecting terminal 60 is returned to its original position by its elastic force. As indicated by the dotted line in FIG. 11, the one end 62 of each connecting terminal 60 is separated from the lead terminal 96 by a predetermined distance. No external force thus does not act on the lead terminals 96. As a result of this, when the IC package 94 is pulled from the IC connector 30, the lead terminals 96 may be easily pulled from the first grooves 58.

The IC package which has been repaired or a new IC package may be mounted on the IC connector 30 by inserting the lead terminals 96 thereof into the first grooves 58. The above procedures are repeated.

The first embodiment of the present invention as described above has the following advantages.

First, since the electrical connection/disconnection between the lead terminals and the connecting terminals may be achieved by sliding the slide plate 34 without requiring moving the IC package, no abnormal force may act on the proximal portions of the lead terminals.

Secondly, since the connecting terminals are brought into contact with the lead terminals against their elastic force, a plurality of lead terminals may contact with the corresponding connecting terminals with a substantially uniform contact pressure.

Thirdly, since an additional part such as a lever need not be incorporated in the IC package, the IC package can have a simple structure.

Fourthly, the range of sliding movement of the slide plate is small, and the operator can easily remove the IC package from the above using a screwdriver or the like. Therefore, the IC connectors may be mounted with a high density on the circuit board.

Lastly, almost no force is applied to the IC package when the IC package is mounted/removed on or from the IC connector. Therefore, the IC package may not be damaged during the mounting/removing operation.

The other embodiments of the present invention will now be described with reference to FIGS. 15 to 20. The same reference numerals in these embodiments denote the same parts as those in the first embodiment, and a detailed description thereof will be omitted.

An IC connector according to the second embodiment of the present invention will now be described with reference to FIG. 15. In an IC connector 97 of the second embodiment, through holes 99 are formed at the center of the bottom plate 38 to be linearly aligned along the longitudinal direction of the bottom plate 38 or along the direction of alignment of the first grooves 58. Support members 101 are formed integrally with the slide plate 34. When the slide plate 34 is fitted in the first recess 36, the support members 101 are inserted in the through holes 99. A distal end 103 of each support member 101 projects outward. The distal ends 103 are slidably engageable with the bottom plate 38.

According to the second embodiment as described above, similar effects to the first embodiment may be obtained. Since the slide plate may slidably engage with the bottom plate by simply through holes in the bottom plate, an IC connector of a more simple structure may be obtained.

The third embodiment of the present invention will now be described with reference to FIGS. 16 to 18.

Figure 16:
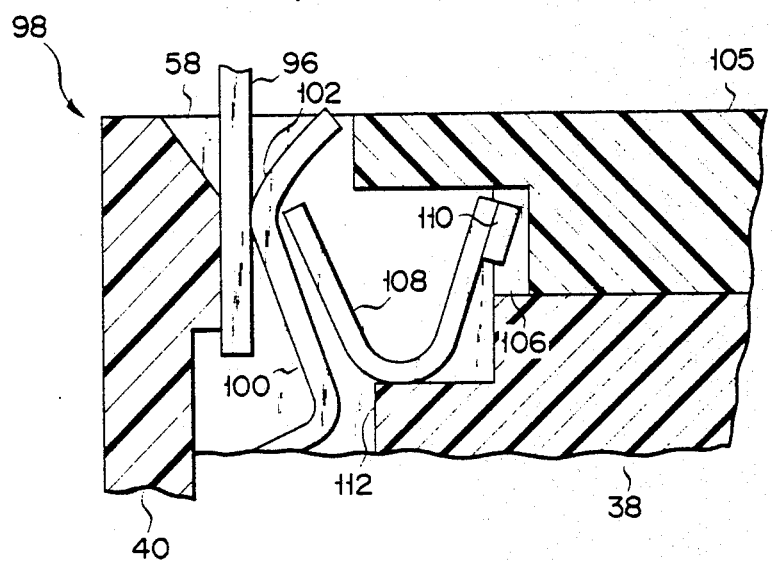
FIG. 16 is a partial sectional view of an IC connector according to a third embodiment of the present invention.

In an IC connector 98 of the third embodiment, as shown in FIG. 16, connecting terminals 100 are arranged in corresponding first grooves 58.

Figure 17:
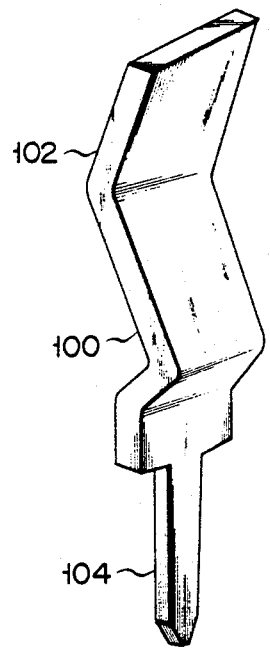
FIGS. 17 and 18 are perspective views of a connecting terminal and a spring shown in FIG. 16.

As shown in FIG. 17, one end 102 of each connecting terminal 100 has a substantially V shape. The other end 104 extends downward and is connected to the printed circuit board (not shown).

Recesses 106 are formed in a slide plate 105 at equal intervals in correspondence with the first grooves 58. A U-shaped spring 108 of an elastic material is interposed between each pair of recesses 106 and connecting terminals 60.

Figure 18:
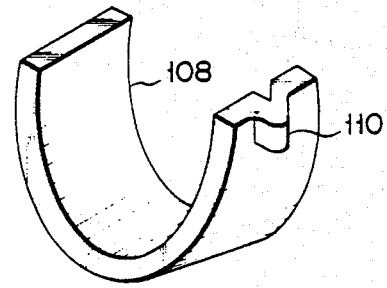

Referring to FIG. 18, a projection 110 of a semicolumnar shape is formed at the outer side of one end of the spring 108. The vertex of the U shape of the spring 108 is placed on a step 112 of the bottom plate 38.

As shown in FIG. 16, when the first groove 58 is aligned with the recess 106, the spring 108 is positioned under no force in the gap defined between the first groove 58 and the recess 106. When the slide plate 105 is slid and the outer wall of the slide plate 105 urges the projection 110, the other end 112 of the spring 108 urges the connecting terminal 100. The connecting terminal 100 is then urged against the lead terminal 96 to achieve reliable electrical connection between the lead terminal 96 and the connecting terminal 100.

In order to remove the IC package from the IC connector, the slide plate 105 is slid to align the recesses 106 with the first grooves 58. Then, the springs 108 are released from the force acting thereon, so almost no force acts on the lead terminals. Therefore, the lead terminals 96 may be pulled from the first grooves 58 without exerting almost any force on the lead terminals 96.

The third embodiment as described above can provide similar effects to the first embodiment. Furthermore, the contact pressure between the lead terminal 96 and the connecting terminal 100 may be varied by changing the shape of the spring 108. Since one end of each connecting terminal is only slightly bent, the processing of the connecting terminal is easy. Since the connecting terminal need not have a great elasticity, the material of the connecting terminal may be advantageously selected.

The fourth embodiment of the present invention will now be described with reference to FIGS. 5, 19 and 20.

Figure 19:
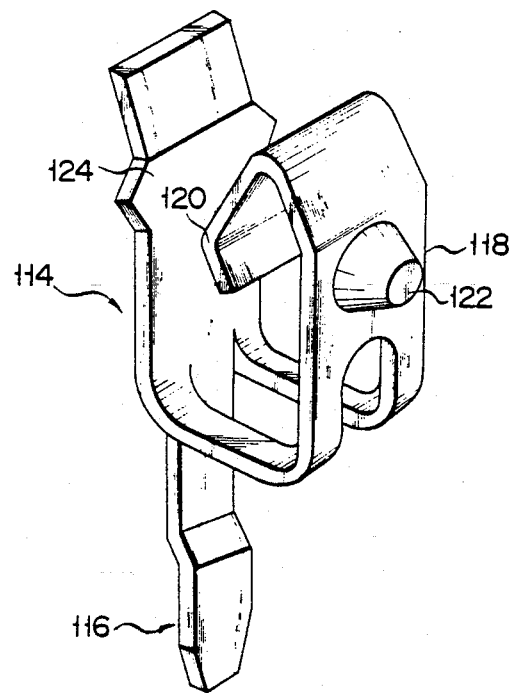
FIG. 19 is a perspective view of a connecting terminal to be used in a fourth embodiment of the present invention.
Figure 20:
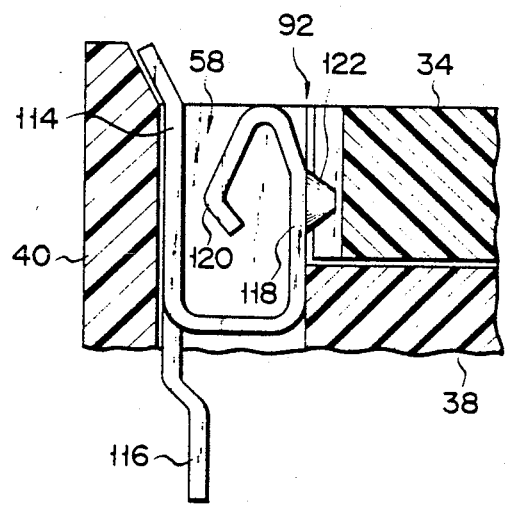
FIG. 20 is a partial sectional view of an IC connector according to the fourth embodiment of the present invention.

In the fourth embodiment, a connecting terminal 114 as shown in FIG. 19 is used in place of the connecting terminal 60 of the IC connector 30 of the first embodiment. The connecting terminal 114 has one end 116 which extends below the bottom plate 38 and which is connected to the printed circuit board (not shown). A bent portion 118 of a substantially U shape is formed at the intermediate portion of the connecting terminal 114. A distal end 120 of the bent portion 118 is bent inward. A projection 122 is formed on the outer surface of the bent portion 118. An engaging portion 124 is formed at the other end of the connecting terminal 114. The engaging portion 124 engages with the surface defining the first groove 58 of wall 40 or 42 and keeps the connecting terminal 114 stationary in the first groove 58. The connecting terminal 114 comprises a single elastic plate. More specifically, one end 116 is punched from the single plate. Then, the bent portion 118 is bent from the portion of the plate surrounding the one end 116 and is bent from the intermediate position of the connecting terminal 114.

When the projection 122 is urged in the IC connector of this structure, the bent portion 118 is bent inward against its elastic force, and the distal end 120 is urged against the lead terminal 96. Thus, the lead terminal 96 is electrically connected to the connecting terminal 114.

The present invention is not limited to the particular embodiments described above. Various other changes and modifications may be made within the spirit and scope of the present invention.

For example, second recesses are formed in the slide plate in correspondence with the first grooves. However, a slide plate may have dimensions to define a gap between itself and each first groove. Then, projections may be formed on the slide plate to extend toward the first grooves 58. In this case, the projections are positioned between the recesses formed in the slide plate. In other words, projections and recesses may alternate in correspondence with the first grooves.

The shape of the second hole which is formed in the slide plate and which receives the distal end of a screwdriver need not be limited to a shape having at least one corner. Similar effects may be obtained if the second hole has a linear shape corresponding to the shape of the distal end of an instrument such as a screwdriver. Moreover, similar effects may be obtained if the opening of the second hole has a substantially triangular shape.

What we claim is:

1. An IC connector for connecting lead terminals extending from an IC package of the in-line type to terminals of a circuit board, comprising:

a slide body which is made of an insulating material and which has an array of first grooves and first projections in at least one surface thereof;

a main body which is made of an insulating material and which has a plurality of second grooves on a surface thereof opposing said one surface of said slide body, said plurality of second grooves being formed along said first grooves and first projections;

connecting terminals, which are made of an electrical conductive material and have an elastic structure, one end of each being mounted in one of said second grooves, and the other end of each being adapted to be connected to a predetermined terminal of the circuit board; and supporting means for supporting said slide body to be movable, along said second grooves, to a first position and a second position; when said slide body is located in said first position, said first and second grooves oppose each other and form a gap between each of said first grooves and a corresponding one of said second grooves so as to receive one of said lead terminals therein, and when said slide body is located in said second position, said first projections oppose said second grooves and said first projections urge said connecting terminals against said second grooves and urge said connecting terminals against said lead terminals when said lead terminals are inserted in said second grooves.

2. An IC connector according to claim 1, wherein said main body has two walls which have opposing surfaces provided with said second grooves and which are spaced apart from each other at a predetermined distance, and said slide body has two surfaces facing said two walls, each of said surfaces having said first grooves and projections.

3. An IC connector according to claim 2, wherein said main body has a bottom plate which is arranged between said two walls and which supports said two walls; and said supporting means has first holes formed in a longitudinal direction along said bottom plate, and engaging members adapted to be slidably engageable with said bottom plate through said first holes.

4. An IC connector according to claim 3, wherein said slide body has a second hole for receiving a distal end of an instrument, and said slide body is slid on said bottom plate when said instrument is operated with said distal end thereof being inserted in said second hole.

5. An IC connector according to claim 4, wherein said second hole has an opening which has a corner formed by two sides and which extends through said slide body; said corner of the opening coresponding to a base of a substantially triangular recess formed in said bottom plate, said slide plate being slid relative to said bottom plate when said distal end of said instrument is pivoted about a corner of said recess to urge one side of said opening of said second hole.

6. An IC connector according to claim 1, wherein said main body and said slide body are made of a synthetic resin.

7. An IC connector according to claim 1, wherein said elastic structure is such that one end of each of said connecting terminals is bent to form a bent portion, and when part of said bent portion is pressed, an elastic force acts on another part of said bent portion.

8. An IC connector according to claim 7, wherein said one end of each of said connecting terminals has a second projection with a spherical surface on the side of said slide body, and said first projections of said slide body contact with and urge against said spherical surfaces of said second projections when said slide body is in the second position.

9. An IC connector according to claim 8, wherein spring members are detachably mounted in said second grooves between said connecting terminals and said slide body, and said spring members are urged by said slide body so that an elastic force thereof may act on said connecting terminals when said slide body is in the second position.

10. An IC connector according to claim 9, wherein said spring members are formed into a U-shape, one end of each of said spring members at the side of said slide plate has a third projection with a spherical surface, said slide body pressing said third projections when said slide body is in the second position, so that the other end of each of said spring members urges each of said connecting terminals.

11. An IC connector according to claim 9, wherein said elastic structure is such that said one end of each of said connecting terminals is formed into a wave-like shape.

12. An IC connector according to claim 1, wherein said elastic structure is such that part of said other end of each of said connecting terminals is bent toward said one end thereof, and said part of said other end and said one end form a U-shaped portion, a remaining portion of said other end extending along a direction in which said second grooves extend.

13. An IC connector according to claim 12, wherein said U-shaped portion of each of said connecting terminals has a fourth projection with a spherical surface at the side of said slide plate, said fourth projection being urged against each of said first projections of said slide body when said slide body is in the second position, thereby biasing said one end of each of said connecting terminals.

* * * * *